(12) United States Patent
Wang

(10) Patent No.: US 9,585,195 B2
(45) Date of Patent: Feb. 28, 2017

(54) ANNEALING APPARATUS AND ANNEALING PROCESS

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventor: Zuqiang Wang, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 264 days.

(21) Appl. No.: 14/368,924

(22) PCT Filed: Nov. 12, 2013

(86) PCT No.: PCT/CN2013/086975
§ 371 (c)(1),
(2) Date: Jun. 26, 2014

(87) PCT Pub. No.: WO2014/190675
PCT Pub. Date: Dec. 4, 2014

(65) Prior Publication Data
US 2015/0289318 A1  Oct. 8, 2015

(30) Foreign Application Priority Data

May 29, 2013 (CN) .......................... 2013 1 0206825

(51) Int. Cl.
*H05B 1/02* (2006.01)
*H05B 3/00* (2006.01)
(Continued)

(52) U.S. Cl.
CPC ......... *H05B 3/0047* (2013.01); *H01L 21/324* (2013.01); *H01L 21/6776* (2013.01); *H01L 21/67115* (2013.01)

(58) Field of Classification Search
CPC .... H05B 3/047; H05B 1/0233; H05B 3/0038; H05B 2203/005; H01L 21/324; H01L 21/67115; H01L 21/6776
(Continued)

(56) References Cited

U.S. PATENT DOCUMENTS 6,379,994 B1 * 4/2002 Sano ..................... H01L 31/182
438/509
6,635,852 B1 * 10/2003 Seiwa ................. F27B 17/0025
118/725

(Continued)

FOREIGN PATENT DOCUMENTS

CN     1202725 A    12/1998
CN   101388334 A     3/2009
(Continued)

OTHER PUBLICATIONS

International Preliminary Report on Patentability Appln. No. PCT/CN2013/086975; Dated Dec. 1, 2015.
(Continued)

*Primary Examiner* — Mark Paschall
(74) *Attorney, Agent, or Firm* — Ladas & Parry LLP

(57) ABSTRACT

An annealing apparatus includes: a temperature-gradient preheating unit, configured for performing a gradient-preheating process for a substrate that is to be annealed by using a gradient temperature; a high temperature heating unit, configured for performing a high temperature heating process for the preheated substrate; and a shifting device, configured for transporting the substrate from the temperature-gradient preheating unit to the high temperature heating
(Continued)

unit when and/or after the substrate is subjected to the gradient-preheating process. The annealing apparatus adopts a gradient heating method to perform a preheating treatment for the substrate, so the annealing efficiency is increased. An annealing process that uses the annealing apparatus is further provided.

20 Claims, 2 Drawing Sheets

(51) Int. Cl.
    *H01L 21/324*     (2006.01)
    *H01L 21/67*     (2006.01)
    *H01L 21/677*     (2006.01)

(58) Field of Classification Search
    USPC ............ 219/121.48, 121.37, 121.59, 121.43; 392/411, 416, 418, 420
    See application file for complete search history.

(56) References Cited

U.S. PATENT DOCUMENTS

| | | | | |
|---|---|---|---|---|
| 7,184,657 B1* | 2/2007 | Camm | ............... | H01L 21/68728 118/724 |
| 7,521,653 B2* | 4/2009 | Gasworth | ............... | C23C 4/134 118/725 |
| 8,295,691 B2* | 10/2012 | Kusuda | ............ | H01L 21/67115 392/407 |
| 8,692,161 B2* | 4/2014 | Doherty | .................... | F27B 9/24 219/388 |
| 9,279,727 B2* | 3/2016 | Cibere | ............. | H01L 21/67115 |
| 2003/0024920 A1* | 2/2003 | Ratliff | .................. | C23C 16/455 219/390 |
| 2006/0237398 A1* | 10/2006 | Dougherty | ............... | H05H 1/24 219/121.43 |
| 2009/0067823 A1* | 3/2009 | Kusuda | ............ | H01L 21/67115 392/418 |
| 2013/0112669 A1* | 5/2013 | Uemura | ............ | H01J 37/32082 219/121.36 |

FOREIGN PATENT DOCUMENTS

| | | |
|---|---|---|
| CN | 101665894 A | 3/2010 |
| CN | 103337457 A | 10/2013 |

OTHER PUBLICATIONS

First Chinese Office Action Appln. No. 201310206825.4; Dated Jun. 12, 2015.

International Search Report Appln. No. PCT/CN2013-086975; Dated Feb. 25, 2014.

* cited by examiner

ANNEALING APPARATUS AND ANNEALING PROCESS

TECHNICAL FIELD

Embodiments of the present invention relate to an annealing apparatus and an annealing process.

BACKGROUND

Flat panel display technologies make people's lives colorful, and with the improvement of the living standards, people's demand for display quality is increasing. The liquid crystal display (LCD) technology has become mature, and related products comprise mobile phone, camera, display, tablet computer, television, outdoor display and the like. People's large demand for display products promotes the development of the display technology objectively, so new display technologies continually appear. The active layer of the thin film transistor (TFT) of a conventional liquid crystal display adopts an amorphous silicon (a-Si) material, and because the amorphous silicon itself has some problems such as low on-state current caused by too many defects, low mobility and poor stability, the applications of the amorphous silicon in many fields are restricted. In order to improve the performance of the thin film transistor and the display effect of a display device, low temperature poly-silicon (LTPS), oxide semiconductor and the like technologies are born accordingly. Low temperature poly-silicon TFTs and oxide semiconductor TFTs have more advantages as compared with the conventional amorphous silicon (a-Si) TFTs, thus attract wide attention and are regarded as the optimal technologies for the backplane for an LCD and an organic electroluminescence display (OLED) of the future. An annealing process is very important in the manufacturing process of a low temperature poly-silicon TFT and an oxide semiconductor TFT, and directly affects the properties of the TFTs.

A conventional annealing apparatus usually involves a single function and a long annealing time; and the conventional annealing apparatus adopts a heating-wire heater or a halogen-lamp heater, so the damage brought for a substrate is larger.

SUMMARY

Embodiments of the present invention provide an annealing apparatus and an annealing process, which can reduce the annealing time and improve the efficiency.

An aspect of the disclosure provides an annealing apparatus, and the annealing apparatus comprises: a temperature-gradient preheating unit, configured for performing a gradient-preheating process for a substrate that is to be annealed by using a gradient temperature; a high temperature heating unit, configured for performing a high temperature heating process for the preheated substrate; and a shifting device, configured for transporting the substrate from the temperature-gradient preheating unit to the high temperature heating unit when and/or after the substrate is subjected to the gradient-preheating process.

For example, in the annealing apparatus, the shifting device can comprise: a guide rail, and a supporting table configured for supporting the substrate that is to be annealed. The supporting table is movably disposed on the guide rail.

For example, in the annealing apparatus, the temperature-gradient preheating unit comprises a plurality of first strobe lamps that are arranged along a movement direction of the substrate, and powers of the first strobe lamps gradually increase along the movement direction of the substrate to realize the gradient-preheating process for the substrate.

For example, in the annealing apparatus, the plurality of the first strobe lamps is evenly distributed inside the temperature-gradient preheating unit.

For example, in the annealing apparatus, the high temperature heating unit comprising a plurality of second strobe lamps that are arranged along the movement direction of the substrate.

For example, in the annealing apparatus, the plurality of the second strobe lamps is evenly distributed inside the high temperature heating unit.

For example, in the annealing apparatus, the first strobe lamp and the second strobe lamp are of a same structure, and the first strobe lamp comprises a quartz tube configured for containing an inactive gas, a negative electrode and a positive electrode that are disposed at two ends of the quartz tube and configured for connecting an external voltage. For example, the inactive gas comprises xenon.

For example, in the annealing apparatus, the high temperature heating unit is provided with an electromagnetic field generator configured for generating a variation magnetic field.

For example, in the annealing apparatus, a plasma induction unit configured for performing a plasma treatment for the substrate is disposed between the temperature-gradient preheating unit and the high temperature heating unit, and a plasma generator is disposed inside the plasma induction unit.

Another aspect of the disclosure further provides an annealing process achieved through the above-mentioned annealing apparatus, and the annealing process comprises: adopting a gradient temperature through a temperature-gradient preheating unit to perform a gradient-preheating process for a substrate that is to be annealed; performing a high temperature heating process for the preheated substrate through a high temperature heating unit; and when and/or after the substrate is subjected to the gradient-preheating process, the substrate is transported from the temperature-gradient preheating unit to the high temperature heating unit.

For example, before performing a high temperature heating process for the preheated substrate, the method can further comprise: performing a plasma treatment for the substrate through a plasma induction unit.

For example, performing a high temperature heating process for the preheated substrate can comprise: applying a variation magnetic field to the substrate through an electromagnetic field generator to accelerate movement of ions inside the substrate.

The embodiments of the present invention adopt a gradient heating method to perform a preheating treatment for the substrate, so the annealing efficiency is increased.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Figure 1:
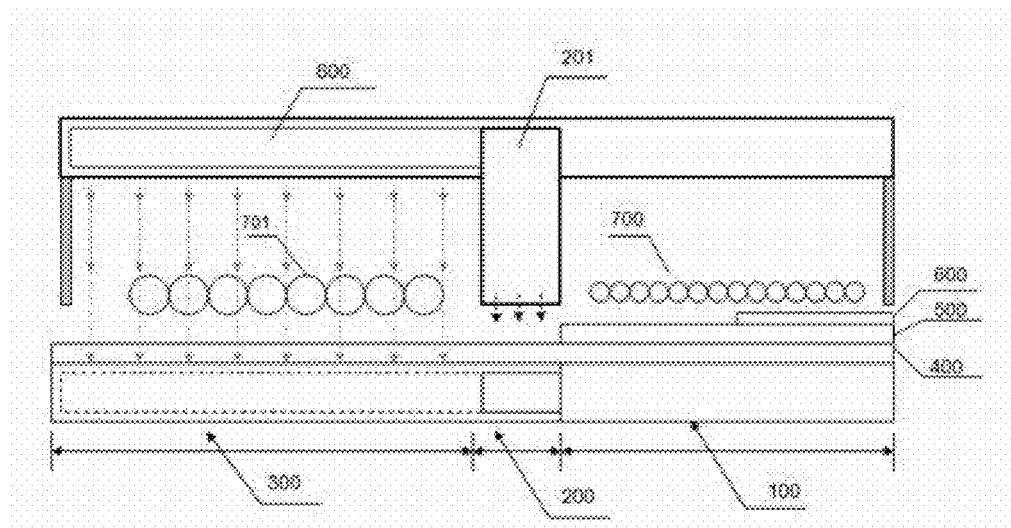
FIG. 1 illustrates a schematic view of a structure of an annealing apparatus in an embodiment of the present invention.
Figures 3, 4:
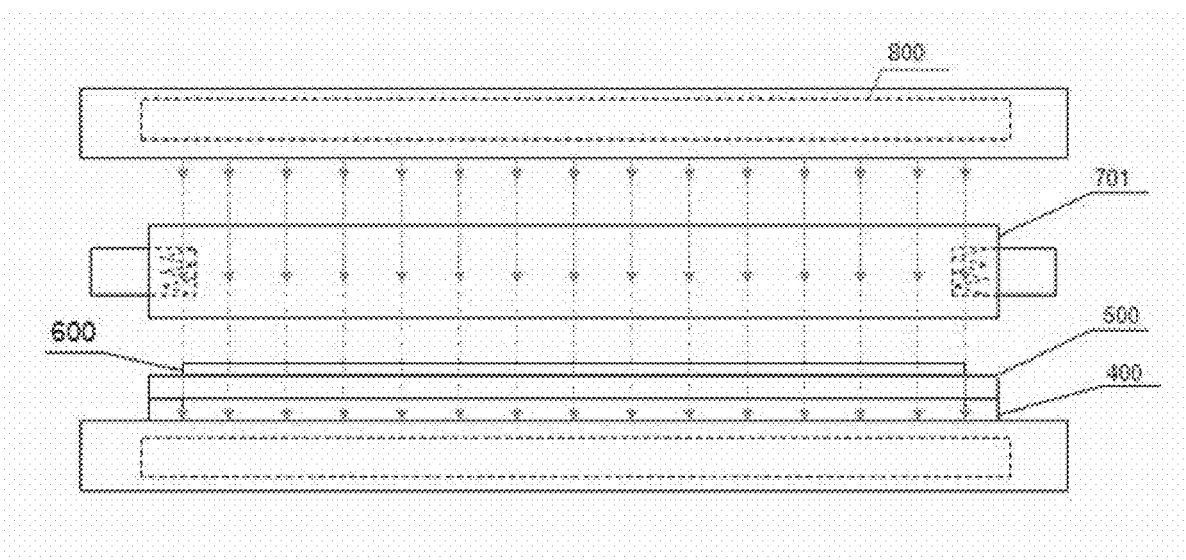
FIG. 3 illustrates a schematic view of a structure of a high temperature heating unit in an embodiment of the present invention.
FIG. 4 illustrates a flow chart of an annealing process in an embodiment of the present invention.

As illustrated in FIG. 1 and FIG. 3, an embodiment of the present invention provides an annealing apparatus, and the annealing apparatus comprises: a temperature-gradient preheating unit 100, configured for performing a gradient-preheating process for a substrate 600 that is to be annealed by using a gradient temperature; a high temperature heating unit 300, configured for performing a high temperature heating process for the preheated substrate 600; and a shifting device, configured for transporting the substrate 600 from the temperature-gradient preheating unit 100 to the high temperature heating unit 300 when and/or after the substrate 600 has been subjected to the gradient-preheating process. The annealing apparatus of the embodiment adopts a gradient heating method to perform a preheating treatment for the substrate 600, so the annealing efficiency is increased.

The shifting device comprises a guide rail 400 and a supporting table 500 configured for supporting the substrate 600 that is to be annealed, and the supporting table 500 is movably disposed on the guide rail 400.

The temperature-gradient preheating unit 100 comprises a plurality of first strobe lamps 700 that are arranged along the movement direction of the substrate 600, and the powers of the first strobe lamps 700 gradually increase along the movement direction of the substrate 600 to realize the gradient-preheating process for substrate 600.

According to the actual need, the power of each first strobe lamp 700 can be determined according to the need as long as a temperature gradient can be achieved to heat the substrate 600, and this increases the annealing efficiency.

In the embodiment, the annealing apparatus comprises a containing space, and the temperature-gradient preheating unit 100 and the high temperature heating unit 300 are respectively disposed at different parts of the containing space. In the embodiment, the temperature-gradient preheating unit 100 and the high temperature heating unit 300 can be disposed above the guide rail 400 and along the movement direction of the supporting table 500 successively.

In order to conveniently control the heating temperature of each first strobe lamp 700 for the substrate 600, which can produce a successively-increasing gradient along the movement direction of the substrate 600, namely, to control the powers of the first strobe lamps 700, the plurality of the first strobe lamps 700 is evenly distributed inside the temperature-gradient preheating unit 100. During work, the plurality of the first strobe lamps 700 can be equidistant from the guide rail 400 respectively.

The arrangement of a plurality of the first strobe lamps 700 is not limited to the way that the plurality of the first strobe lamps 700 is equidistant from the guide rail 400. In the annealing apparatus of another embodiment of the present invention, a plurality of the first strobe lamps 700 is of the same power, and the temperature gradient for heating the substrate 600 is achieved through the arrangement in which a plurality of the first strobe lamps 700 and the guide rail 400 are of different distances respectively.

A plurality of second strobe lamps 701 is disposed inside the high temperature heating unit 300 and in a direction parallel to the guide rail 400.

In order to conveniently control the heating temperature of each second strobe lamp 701 for the substrate 600, namely, to control the powers of the second strobe lamps 700, the plurality of the second strobe lamps 700 can be evenly distributed inside the high temperature heating unit 300. During work, the plurality of the second strobe lamps 700 can be equidistant from the guide rail 400 respectively.

The powers of the second strobe lamps 701 can be greater than or equal to or smaller than that of the first strobe lamp 700 which has the maximal power among a plurality of the first strobe lamps 700, and the powers of a plurality of the second strobe lamps 701 can be the same or be different, and be determined according to the actual annealing requirement.

The high temperature heating unit 300 is provided with an electromagnetic field generator 800 configured for generating a changing magnetic field, and the electromagnetic field generator 800 can be disposed above the guide rail 400. Under the effect of the electromagnetic field, the ions in the substrate 600 can be moved faster, so the annealing efficiency is increased.

In the embodiment, the electromagnetic field generator 800 is disposed over the second strobe lamps 701.

A plasma induction unit 200 configured for performing a plasma treatment for the substrate 600 is disposed between the temperature-gradient preheating unit 100 and the high temperature heating unit 300, and a plasma generator 201 is disposed inside the plasma induction unit 200.

The installation of the plasma induction unit 200 adds functions to the annealing apparatus. For example, when a hydrogen treatment is performed for the substrate 600, the plasma generator generates a hydrogen-rich plasma to treat the surface of the substrate, which accelerates the diffusion of the ions in the substrate and helps to increase the hydrogenation efficiency; and the generated plasma can be used for etching the surface of the substrate 600 according to the need to realize a smoothing treatment for the substrate 600, so that the surface of the substrate 600 forms a smooth plane.

Figure 2:
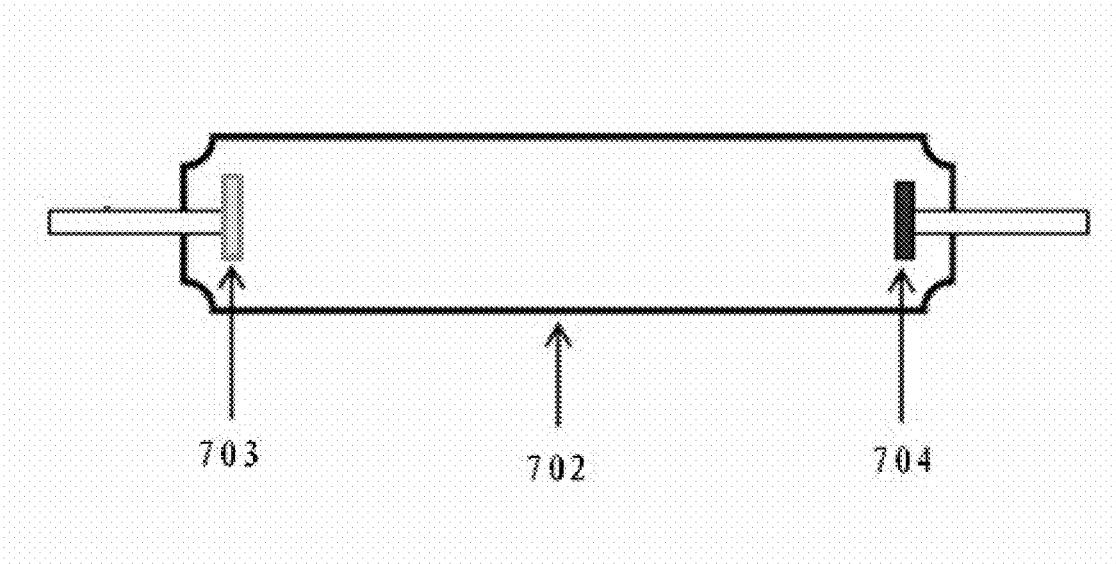
FIG. 2 illustrates a schematic view of a structure of a strobe lamp in an embodiment of the present invention.

As illustrated in FIG. 2, the first strobe lamps 700 and the second strobe lamps 701 can be of a same structure, and a first strobe lamp 700 comprises a quartz tube 702 configured for containing an inactive gas, a negative electrode 703 and a positive electrode 704 that are disposed at the two ends of the quartz tube 702 and configured for connecting an external voltage.

In the embodiment, the inactive gas can be xenon. The pulse time (50-100 μs) of the first strobe lamps 700 and the second strobe lamps 701 that use xenon is smaller than the pulse time (ms magnitude) of a halogen lamp; and due to a smaller pulse duration, the damage for the substrate become smaller.

Introductions for the annealing apparatus of the disclosure will be given in the following taking LTPS (low temperature poly-silicon) as an example. LTPS is more dependent on an anneal, and the manufacture procedure of LTPS differs from that of a conventional amorphous silicon mostly in that the LTPS manufacture procedure has more heat treatment procedures and generally comprises dehydrogenation, ion activation, hydrogen diffusion (hydrogenation) and the like. The precision control of the annealing time and temperature evidently affects the performances of an LTPS TFT, and therefore an annealing apparatus is very important to the LTPS technology. In manufacturing LTPS, the time of performing an annealing process to conduct crystallization is usually smaller than 600 degree Centigrade.

In an embodiment of performing a dehydrogenation treatment (removing hydrogen in an amorphous silicon thin film), the substrate 600 firstly enters the temperature-gradient preheating unit 100, and the temperature-gradient preheating unit 100 adopts a temperature-gradient design and gradually changes the powers of a plurality of the first strobe lamps 700, so that the heating temperatures with a gradient for the substrate 600 are established, and this can increase the dehydrogenation efficiency greatly; the substrate 600 then enters the plasma induction unit 200; and the substrate 600 finally enters the high temperature heating unit 300 that comprises the electromagnetic field generator 800, the second strobe lamps 701 perform a high temperature heating process for the substrate 600, and with the assistance of the electromagnetic field, the hydrogen ions escape faster, which can increase the dehydrogenation efficiency. Herein, during the operation, the plasma induction unit 200 can sever as an option and be turned on/off according to the need; further, the electromagnetic field generated by the electromagnetic field generator 800 performs a function of an assistance-annealing treatment inside the high temperature heating unit 300 and its switch state can also be controlled according to the actual need.

In an embodiment of performing a dehydrogenation (increasing the content of the hydrogen bond) treatment for the substrate 600, the substrate 600 firstly enters the temperature-gradient preheating unit 100, and the temperature-gradient preheating unit 100 adopts a temperature-gradient design and gradually changes the powers of the first strobe lamps 700, so that the heating temperatures with a gradient are established, and this can increase the movement activity of the ions greatly; the substrate 600 then enters the plasma induction unit 200, and the hydrogen-rich plasma can be used to treat the surface of the substrate 600, which helps to increase the hydrogenation efficiency; and the substrate 600 finally enters the high temperature heating unit 300 that comprises the electromagnetic field generator 800, the second strobe lamps 701 perform a high temperature heating process for the substrate 600, and under the action of the variation electromagnetic field, help the hydrogen ions to move to a destination layer, which increases the dehydrogenation efficiency.

In an embodiment of performing an activation (implanted ion activation, lattice restoration) treatment for the substrate 600, the substrate 600 firstly enters the temperature-gradient preheating unit 100, and the temperature-gradient preheating unit 100 adopts a temperature-gradient design and gradually changes the powers of the first strobe lamps 700, so that the heating temperatures with a gradient for the substrate 600 are established, and this can increase the movement activity of the ions greatly; the substrate 600 then enters the plasma induction unit 200; and the substrate 600 finally enters the high temperature heating unit 300 that comprises the electromagnetic field generator 800, the second strobe lamps 701 perform a high temperature heating process for the substrate 600, and under the action of the variation electromagnetic field, help the hydrogen ions to move, which increases the dehydrogenation efficiency. Herein, the plasma induction unit 200 can sever as an option and be turned on/off according to the need.

As illustrated in FIG. 4, an embodiment of the present invention further provides an annealing process achieved through the above-mentioned annealing apparatus, and the annealing process can be performed as follows.

A gradient temperature is produced through a temperature-gradient preheating unit to perform a gradient-preheating process for a substrate to be annealed; a high temperature heating process for the preheated substrate is performed through a high temperature heating unit. When and/or after the substrate is subjected to the gradient-preheating process, the substrate is transported from the temperature-gradient preheating unit to the high temperature heating unit.

For example, before a high temperature heating process for the preheated substrate is performed, the annealing process can further comprise that a plasma treatment for the substrate is performed through a plasma induction unit.

An example of performing a high temperature heating process for the preheated substrate comprises: a variation magnetic field is applied to the substrate through an electromagnetic field generator to accelerate the movement of the ions inside the substrate.

What are described above is related to the illustrative embodiments of the disclosure only and not limitative to the scope of the disclosure; the scopes of the disclosure are defined by the accompanying claims.

The invention claimed is:

1. An annealing apparatus, comprising:
   a temperature-gradient preheating unit, configured for performing a gradient-preheating process for a substrate that is to be annealed by using a gradient temperature;
   a high temperature heating unit, configured for performing a high temperature heating process for the preheated substrate; and
   a conveying device, configured for transporting the substrate from the temperature-gradient preheating unit to the high temperature heating unit when and/or after the substrate is subjected to the gradient-preheating process,
   wherein the temperature-gradient preheating unit and the high temperature heating unit are disposed above the conveying device.

2. The annealing apparatus according to claim 1, wherein the conveying device comprises:
   a guide rail; and
   a supporting table configured for supporting the substrate that is to be annealed, wherein the supporting table is movably disposed on the guide rail.

3. The annealing apparatus according to claim 1, wherein the temperature-gradient preheating unit comprises a plurality of first strobe lamps that are arranged along a movement direction of the substrate, and powers of the first strobe lamps gradually increase along the movement direction of the substrate to perform the gradient-preheating process for the substrate.

4. The annealing apparatus according to claim 3, wherein the plurality of the first strobe lamps is evenly distributed inside the temperature-gradient preheating unit.

5. The annealing apparatus according to claim 3, wherein the high temperature heating unit comprising a plurality of second strobe lamps that are arranged along the movement direction of the substrate.

6. The annealing apparatus according to claim 5, wherein the plurality of the second strobe lamps is evenly distributed inside the high temperature heating unit.

7. The annealing apparatus according to claim 6, wherein the first strobe lamps and the second strobe lamps are of a same structure, and a first strobe lamp comprises a quartz tube configured for containing an inactive gas, a negative electrode and a positive electrode that are disposed at two ends of the quartz tube and configured for connecting an external voltage.

8. The annealing apparatus according to claim 7, wherein the inactive gas comprises xenon.

9. The annealing apparatus according to claim 1, wherein the high temperature heating unit is provided with an electromagnetic field generator configured for generating a variation magnetic field.

10. The annealing apparatus according to claim 1, wherein a plasma induction unit configured for performing a plasma treatment for the substrate is disposed between the temperature-gradient preheating unit and the high temperature heating unit, and a plasma generator is disposed inside the plasma induction unit.

11. The annealing apparatus according to claim 2, wherein the temperature-gradient preheating unit comprises a plurality of first strobe lamps that are arranged along a movement direction of the substrate, and powers of the first strobe lamps gradually increase along the movement direction of the substrate to perform the gradient-preheating process for the substrate.

12. The annealing apparatus according to claim 11, wherein the plurality of the first strobe lamps is evenly distributed inside the temperature-gradient preheating unit.

13. The annealing apparatus according to claim 11, wherein the high temperature heating unit comprising a plurality of second strobe lamps that are arranged along the movement direction of the substrate.

14. The annealing apparatus according to claim 13, wherein the plurality of the second strobe lamps is evenly distributed inside the high temperature heating unit.

15. The annealing apparatus according to claim 3, wherein the high temperature heating unit is provided with an electromagnetic field generator configured for generating a variation magnetic field.

16. The annealing apparatus according to claim 3, wherein a plasma induction unit configured for performing a plasma treatment for the substrate is disposed between the temperature-gradient preheating unit and the high temperature heating unit, and a plasma generator is disposed inside the plasma induction unit.

17. The annealing apparatus according to claim 5, wherein a plasma induction unit configured for performing a plasma treatment for the substrate is disposed between the temperature-gradient preheating unit and the high temperature heating unit, and a plasma generator is disposed inside the plasma induction unit.

18. An annealing process achieved through the annealing apparatus, comprising the following steps of:
   using a gradient temperature through a temperature-gradient preheating unit to perform a gradient-preheating process for a substrate that is to be annealed; and
   performing a high temperature heating process for the preheated substrate through a high temperature heating unit;
   wherein, when and/or after the substrate is subjected to the gradient-preheating process, the substrate is transported from the temperature-gradient preheating unit to the high temperature heating unit,
   wherein the temperature-gradient preheating unit and the high temperature heating unit are disposed above the conveying device.

19. The annealing process according to claim 18, before performing a high temperature heating process for the preheated substrate, further comprising the following step of:
   performing a plasma treatment for the substrate through a plasma induction unit.

20. The annealing process according to claim 18, wherein performing of a high temperature heating process for the preheated substrate comprises:
   applying a variation magnetic field to the substrate through an electromagnetic field generator to accelerate movement of ions inside the substrate.

* * * * *